United States Patent [19]
Iknaian et al.

[11] Patent Number: 5,294,842
[45] Date of Patent: Mar. 15, 1994

[54] UPDATE SYNCHRONIZER

[75] Inventors: Russell Iknaian, Groton; Richard B. Watson, Jr., Harvard, both of Mass.

[73] Assignee: Digital Equipment Corp., Maynard, Mass.

[21] Appl. No.: 763,795

[22] Filed: Sep. 23, 1991

[51] Int. Cl.$^5$ .............................................. H03L 7/00
[52] U.S. Cl. ..................................... 307/269; 328/63; 328/72; 375/106; 375/107; 375/119
[58] Field of Search ................... 307/269; 328/63, 72; 375/107, 106, 119, 118, 120, 81, 269

[56] References Cited

U.S. PATENT DOCUMENTS

| | | | |
|---|---|---|---|
| 4,534,044 | 8/1985 | Funke et al. | 375/120 |
| 4,584,695 | 4/1986 | Wong et al. | 375/81 |
| 4,780,889 | 10/1988 | Ley et al. | 375/106 |
| 4,973,860 | 11/1990 | Ludwig | 307/269 |
| 4,977,582 | 12/1990 | Nichols et al. | 375/118 |

FOREIGN PATENT DOCUMENTS

88/1206627 5/1989 European Pat. Off. .
91/1023646 9/1991 European Pat. Off. .

Primary Examiner—John S. Heyman
Assistant Examiner—My Trang Nu Ton
Attorney, Agent, or Firm—Cesari and McKenna

[57] ABSTRACT

An update synchronizer includes a two-stage synchronization unit for generating enable signals to select an output signal from among multiple input clock signals of a clock delay multiplexer. The enable signals originate from an asynchronous control signal having a phase different from that of the clock signals. A pre-synchronization logic stage transforms the asynchronous control signal into complementary synchronous control signals for use by the clock synchronization units; these synchronous control signals, in turn, are transformed into complementary selection enable signals having phases within the domains of the input clock signals. This ensures that transitions of the enable signals occur during the same clock period.

6 Claims, 9 Drawing Sheets

UPDATE SYNCHRONIZER

FIELD OF THE INVENTION

This invention relates generally to synchronizing signals in a computer system and, more specifically, to the synchronization of digital clock signals with an asynchronous control signal having a phase different from that of the clock signals.

BACKGROUND OF THE INVENTION

A bus is commonly employed to interconnect modules of a computer system and to transfer signals between them so that desired operations may be carried out by the system. One of the signals transferred between the modules is a clock signal used to control the timing of the desired operations. Specifically, the clock signal synchronizes the transmission and reception of data between the bus interface circuitry on each module.

For proper operation of the computer system, clock signals should arrive at the interface circuitry of the various modules at the same time; otherwise, reliable data transmission is not ensured. For example, if a module receiving data is "clocked" later than others, data placed on the bus by an earlier-clocked module may disappear before the receiving module has retrieved it from the bus. In order to avoid this problem, the data may be maintained on the bus long enough to ensure that even the late-clocked modules can receive it. However, the lack of simultaneity in reception of the clock signals at the modules, i.e., clock skew, directly impacts the performance of the synchronous computer. That is, the greater the skew, the longer the time required for each bus transfer in order to ensure proper reception of data transferred over the bus.

The amount of clock skew introduced into a computer system is a direct function of the variations in propagation delays among clock receiver chips of the system. These chips typically receive the clock signals and buffer, i.e., amplify, them. However, buffering of low-level signals with semiconductor chips to develop high-level digital pulse signals is very susceptible to propagation delay variations due to process, voltage, temperature and loading (PVTL) variations. Differences in propagation delay between clock "buffer" chips in a system directly translate into skew.

The problem of clock skew is addressed partly by employing a system clock source and distributing the clock signals to the respective modules. Distribution is accomplished in a manner such that the clock signals arrive essentially simultaneously at the modules. However, in each module the incoming clock signals must be processed, i.e., shaped, amplified and regenerated into multiple copies, before use by various circuits on the module. Such processing necessarily delays the signals; the delays can be expected to vary from module to module because of PVTL variations. These variations contribute significantly to clock skew, which must be reduced prior to further distribution of the clock signals.

One approach to reducing skew involves the use of an absolute delay regulator, which performs a precise measurement of the propagation delay of the clock signal in passing through the processing circuitry and then adjusts that delay so as to maintain a fixed-phase relationship between a non-processed input clock signal and the processed clock signal. An absolute delay regulator of this type is disclosed in patent application titled, METHOD AND APPARATUS FOR CLOCK SKEW REDUCTION THROUGH ABSOLUTE DELAY REGULATION, by Watson, Jr. et al. filed herewith, which application is expressly incorporated by reference as though fully set forth herein.

Specifically, the absolute delay regulator employs two delay adjusting units configured such that one adjusts an input clock signal by adding a desired amount of delay, while the other compensates for previously-measured propagation delays encountered by the input signal. The regulator then selects the updated clock signal from the proper delay unit and distributes it to circuitry external to the regulator. Thereafter, the roles of the delay adjusting units are switched and the regulator selects the updated clock signal from the other delay unit.

Selection of the updated clock signals is controlled by logic external to the processing circuitry. The logic thus generates a control signal that is asynchronous to the clock signals processed by the delay regulator. Timing problems may result from the lack of synchronization between the control and clock signals. The present invention is directed to the synchronization of the asynchronous control signal to the clock signals; in addition, the present invention enables distribution of the updated clock signal without interruption of system operation.

Therefore, it is among the objects of this invention to provide an arrangement for selecting an updated output clock signal from among various input clock signals without interrupting computer system operation.

Another object of the invention is to synchronize the clock signals with an asynchronous control signal having a phase that is different from that of the clock signals.

Yet another object of the present invention is to redistribute multiple copies of an updated, low-skew clock signals to circuitry on a module without disrupting the continuous flow of output clock signals.

SUMMARY OF THE INVENTION

Briefly, an update synchronizer constructed in accordance with the invention includes a two-stage synchronization unit for generating enable signals to select an output signal from among multiple input clock signals of a clock delay multiplexer. The enable signals originate from an asynchronous control signal having a phase different from that of the clock signals. The update synchronizer includes a pre-synchronization logic stage coupled to individual clock synchronization units. The pre-synchronization logic transforms the asynchronous control signal into complementary synchronous control signals for use by the clock synchronization units; these synchronous control signals, in turn, are transformed into complementary selection enable signals having phases within the domains of the input clock signals. This ensures that transitions of the two enable signals occur during the same clock period.

Specifically, the synchronization units comprise "dual-rank" synchronizers arranged in back-to-back, flip-flop configurations. In addition, the clock delay multiplexer comprises tri-state drivers arranged in a "wire OR" configuration; the drivers are controlled by the selection enable signals generated by the update synchronizer.

The update synchronizer also includes logic circuitry that allows switching among the input clock signals in a timely manner without interrupting the output signal of the multiplexer. An appropriate switching time is when the input clock signals are non-asserted, i.e., at a "low" state. In an aspect of the invention, the circuitry includes a logic OR gate having inputs coupled to the clock signals and an output connected to the pre-synchronization logic. The use of the logic gate ensures that when the input clock signals are low, the output of the gate is also low.

Therefore, in accordance with the purpose of the invention as embodied and broadly described herein, a synchronizer is provided for generating selection enable signals to select an output signal from among multiple input clock signals of a multiplexer. The selection enable signals originate from an asynchronous control signal having a phase different from that of the clock signals. The synchronizer comprises: means for conditioning the input clock signals for output selection by the multiplexer, means for transforming the asynchronous control signal into complementary synchronous control signals, and means for transforming the complementary synchronous control signals into complementary selection enable signals having phases within the domains of the input clock signals. As a result, selection of the output signal from among the input signals of the multiplexer is performed dynamically and in a manner that avoids momentary interruption of the output signal.

Specifically, an advantage of the invention is that a smooth, continuous output clock signal is produced by the delay multiplexer when updating its output by switching between a previously-selected input clock signal and a recently-updated input clock signal. Moreover, the manner of switching among the input signals does not compromise the integrity of the output signal.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
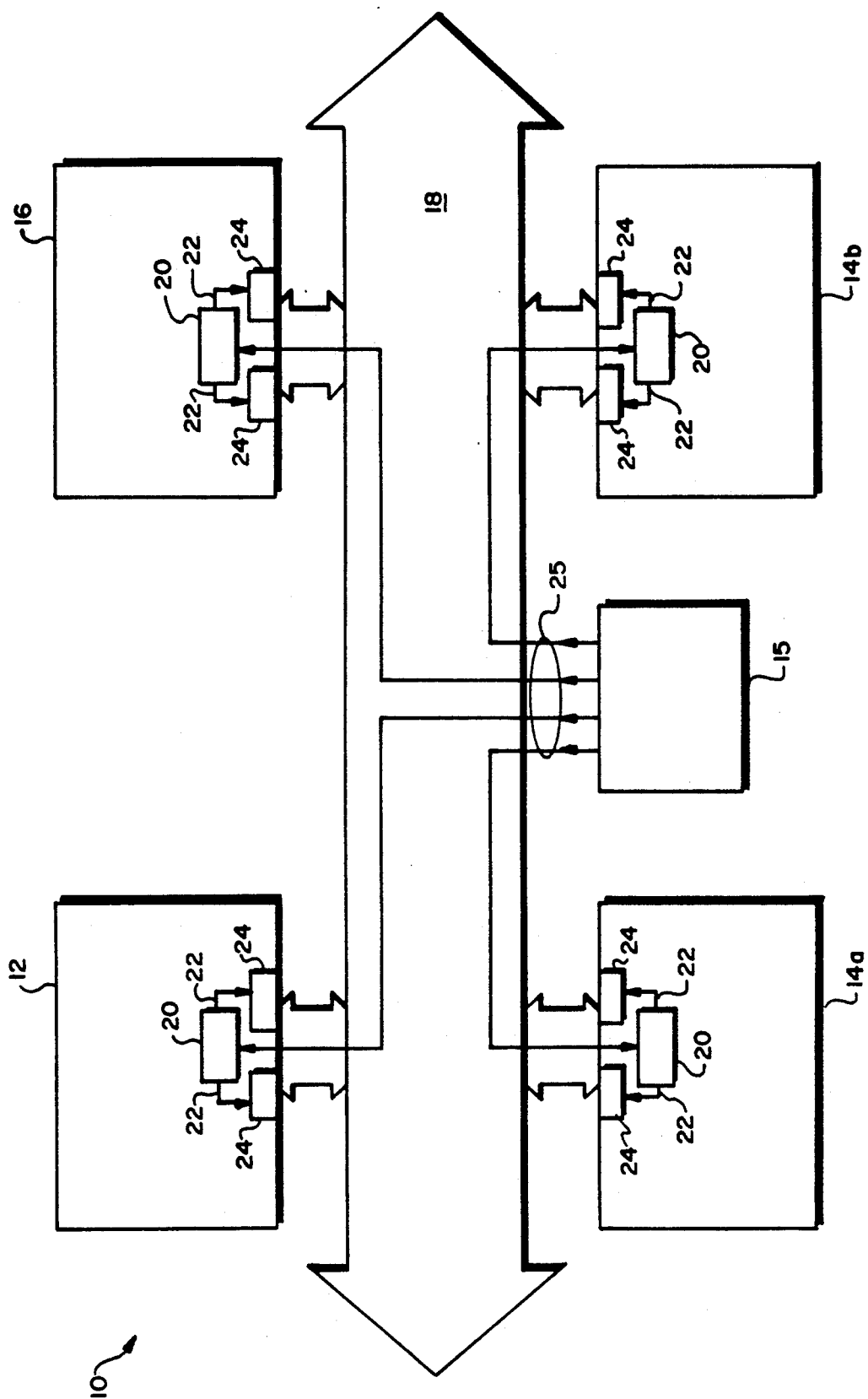
FIG. 1 is a block diagram of a computer system including modules having a clock repeater chip for receiving a globally distributed system clock signal.

Referring to FIG. 1, a synchronous computer system 10 typically includes a central processing unit module 12, main memory modules 14a, 14b and an input/output unit module 16 interconnected by a high-speed, bidirectional synchronous bus 18. A clock module 15 generates a system clock signal to synchronize the operations of the computer system. The system clock signal is globally-distributed via separate, generally radial, unidirectional clock lines 25 of the synchronous bus 18 to each module of the computer 10.

A clock repeater chip 20 located on each module receives the distributed system clock signal as an input signal. The repeater chip 20 is preferably a VLSI CMOS custom integrated circuit chip functionally configured to shape and amplify the input signal prior to generating multiple copies of it. The resulting output clock signals are thereafter distributed to circuitry, e.g., bus interface circuitry 24, on each module. Preferably, the chip 20 converts controlled-edge, system clock signals with low-level voltages to a 0-5 v, 50% duty cycle digital pulse required by the bus interface chips 24.

Any number of clock signals may be "skew-regulated" by the repeater chip 20 by including additional delay regulation circuitry, as further described below. In general, the clock signals may have phases different than the system clock signal. For example, an embodiment of the present invention may support two clock channels. The second channel supports delay regulation and distribution of a second clock signal having the same frequency as the system clock signal, but locked in phase quadrature.

Figure 2:
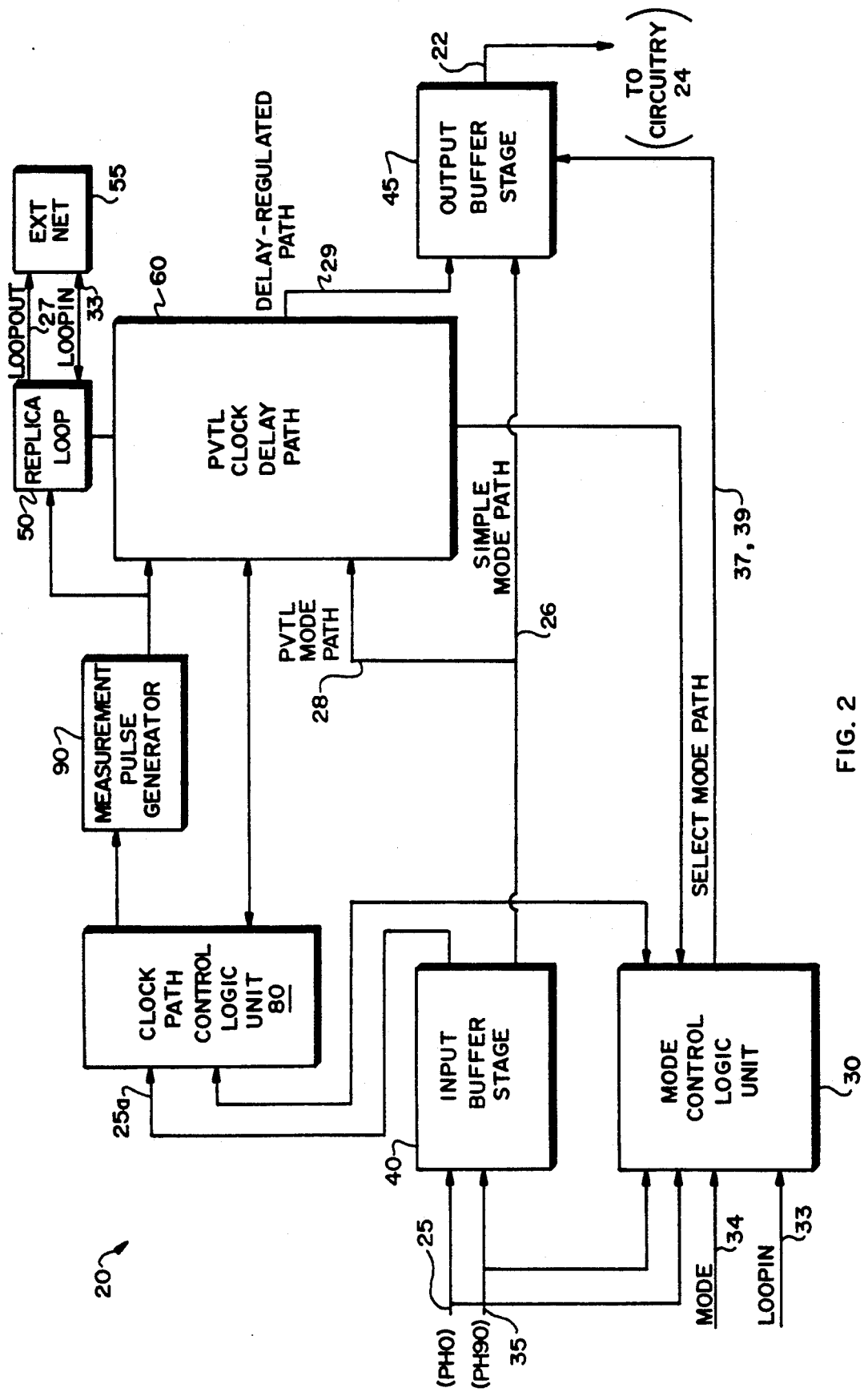
FIG. 2 is a block diagram of the clock repeater chip including a delay regulator circuit.

FIG. 2 is a block diagram of a clock repeater chip 20 including a delay regulator circuit. The system clock signal, PH0 on line 25, and the second clock signal, PH90 on line 35, are received at an input "buffer" stage 40, where they are processed, i.e., shaped and amplified. The processed clock signals may then be driven directly, i.e., "simple mode path" via line 26, to an output buffer stage 45 where they are regenerated into multiple copies for distribution to circuitry 24 on the module. As an alternative, the processed clock signals may be driven through a clock delay path 60 (FIG. 2) via a "process, voltage, temperature and loading (PVTL) mode path" 28 that is used to delay the signals prior to delivery to the output buffer stage 45.

Figure 3:
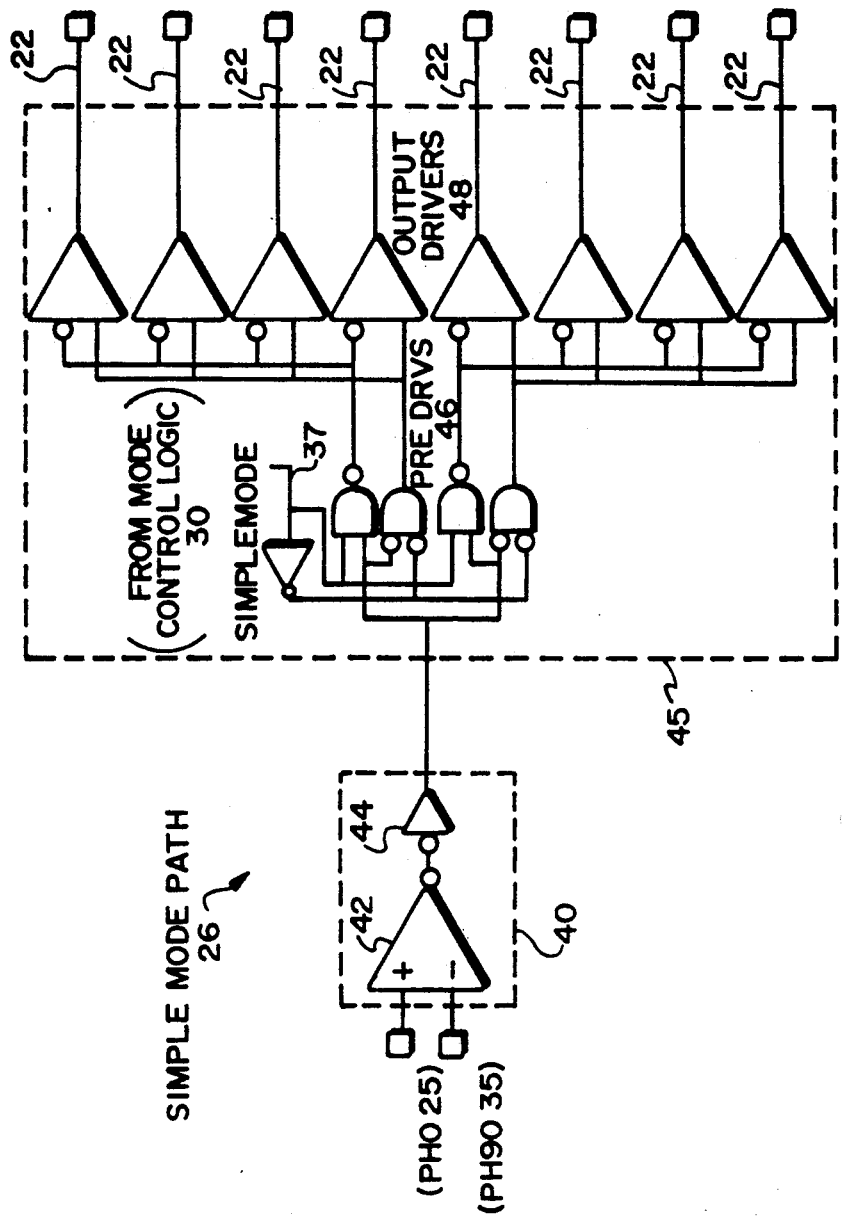
FIG. 3 is a diagram of a simple mode clock path of the repeater chip of FIG. 2.

FIG. 3 is a diagram of the simple mode path 26. The input buffer stage 40 comprises differential and post-amplifier circuitry. Specifically, a differential amplifier 42 receives a low-level input signal, i.e., either square or limited-edge rate wave, and produces a "shaped", amplified square wave pulse having approximately the desired amplitude. The post-amplifier 44 "cleans-up" the differential amplifier output signal; that is, it functions as a level-shifter to deliver a full amplitude signal to the output buffer stage 45. The post-amplifier 44 also ensures the duty cycle of the signal is correct and in phase with the input signal PH0 on line 25 (or PH90 on line 35).

The output buffer stage 45 comprises a predriver section 46 including AND and NAND gate circuitry, and an output driver section 48 including a plurality of tri-state drivers. The output buffer section 45 is divided into two segments to accomodate the simple mode 26 and the PVTL mode 28 paths. For purposes of clarity, only the simple mode segment is shown. Functionally, the predrivers 46 are enabled by the SIMPLEMODE signal on line 37 generated by the mode control logic unit 30. The predrivers 37, in turn, generate multiple copies of the processed input signal, while the output drivers 48 distribute these signals to circuitry on the module.

Referring again to FIG. 2, the PVTL mode path 28 enables measurement and delay compensation for the processed input signal. An absolute delay regulator circuit operates in a cyclical fashion by periodically measuring the intrinsic delay of a clock path, including the PVTL clock delay path 60, on the chip 20. After a measurement, one of two delay adjusting units within the clock delay path 60 is updated, while the other delay unit determines the actual delay of the chip 20 from a previous measurement cycle. Specifically, the regulator updates a delay unit by adding a controlled amount of delay to the processed clock signal propagating through a delay line so that the output clock signal maintains a fixed-phase relationship with the input signal.

In accordance with the teachings set forth herein, the invention maintains a fixed-phase relationship among all clock signals emanating from repeater chips of the computer system. Because of the global-clock distribution arrangement employed by the computer, nearly all skew-producing buffering in the system is embedded in the repeater chips 20. The fixed-phase relationship between input and output clock signals is maintained by adding an integer number of clock cycles of delay to each input clock signal. Since "in-phase" digital clock signals are exact images of each other, the waveforms of an undelayed clock signal and a clock signal delayed by an integer number of in-phase cycles are identical. The amount of added delay is based upon the intrinsic delay characteristics of each chip.

The PVTL clock delay path 60 on the repeater chip 20 includes the logic circuitry required to measure and compensate for the intrinsic delay of the chip. A "replica loop" circuit 50 simulates the logic and associated propagation delay of the clock path, as described further herein. An external loading network 55, coupled between LOOPIN on line 33 and LOOPOUT on line 27, simulates the loading of printed circuit board etch traces connected to the outputs of chip 20, leading to external loads. A pulse generator 90 supplies a precise measurement pulse needed to operate the clock delay path 60 and replica loop 50, while a clock path control logic unit 80 provides the necessary timing signals to perform delay regulation on the chip 20.

Figure 4:
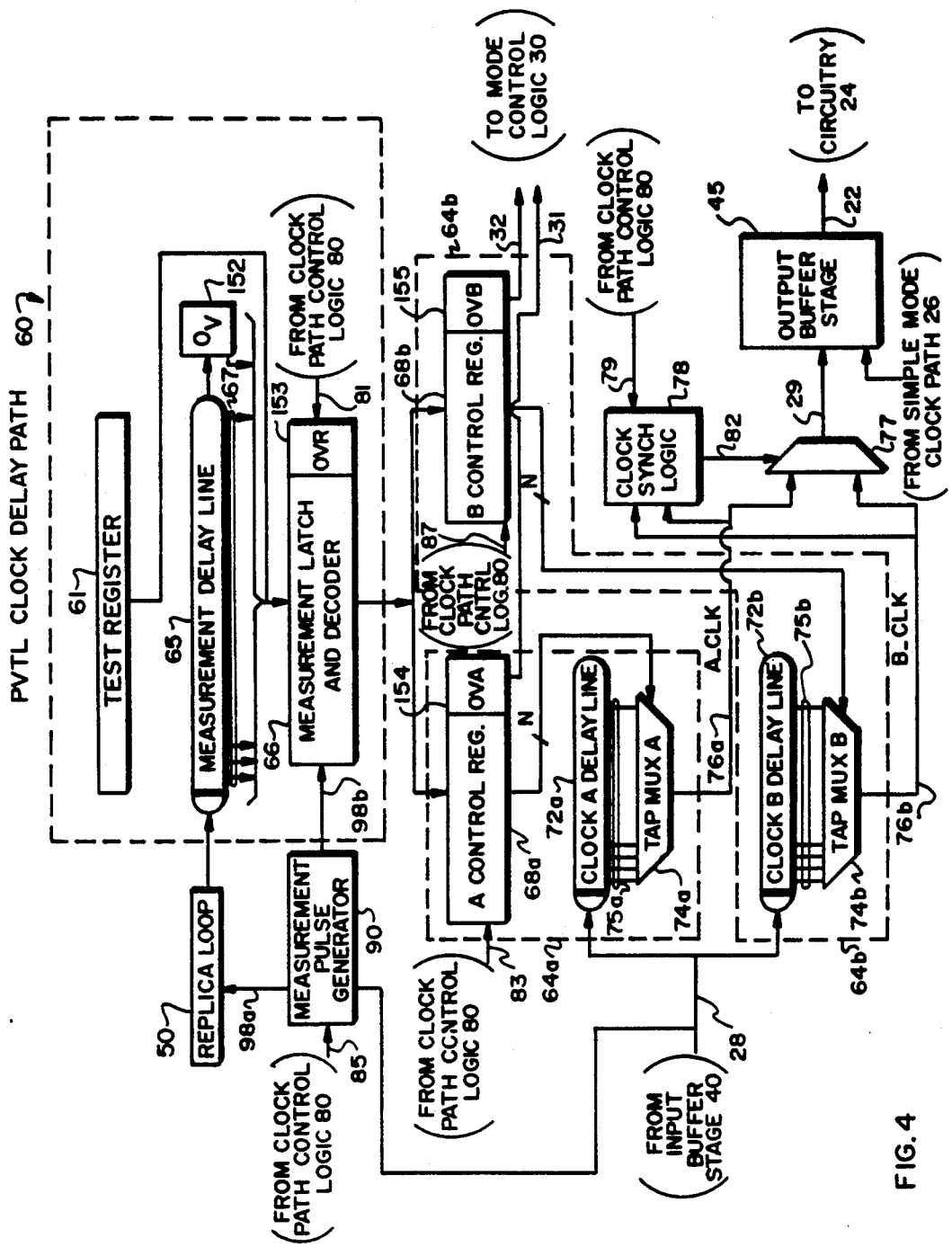
FIG. 4 is a block diagram of a clock delay path of the delay regulator.
Figure 7:
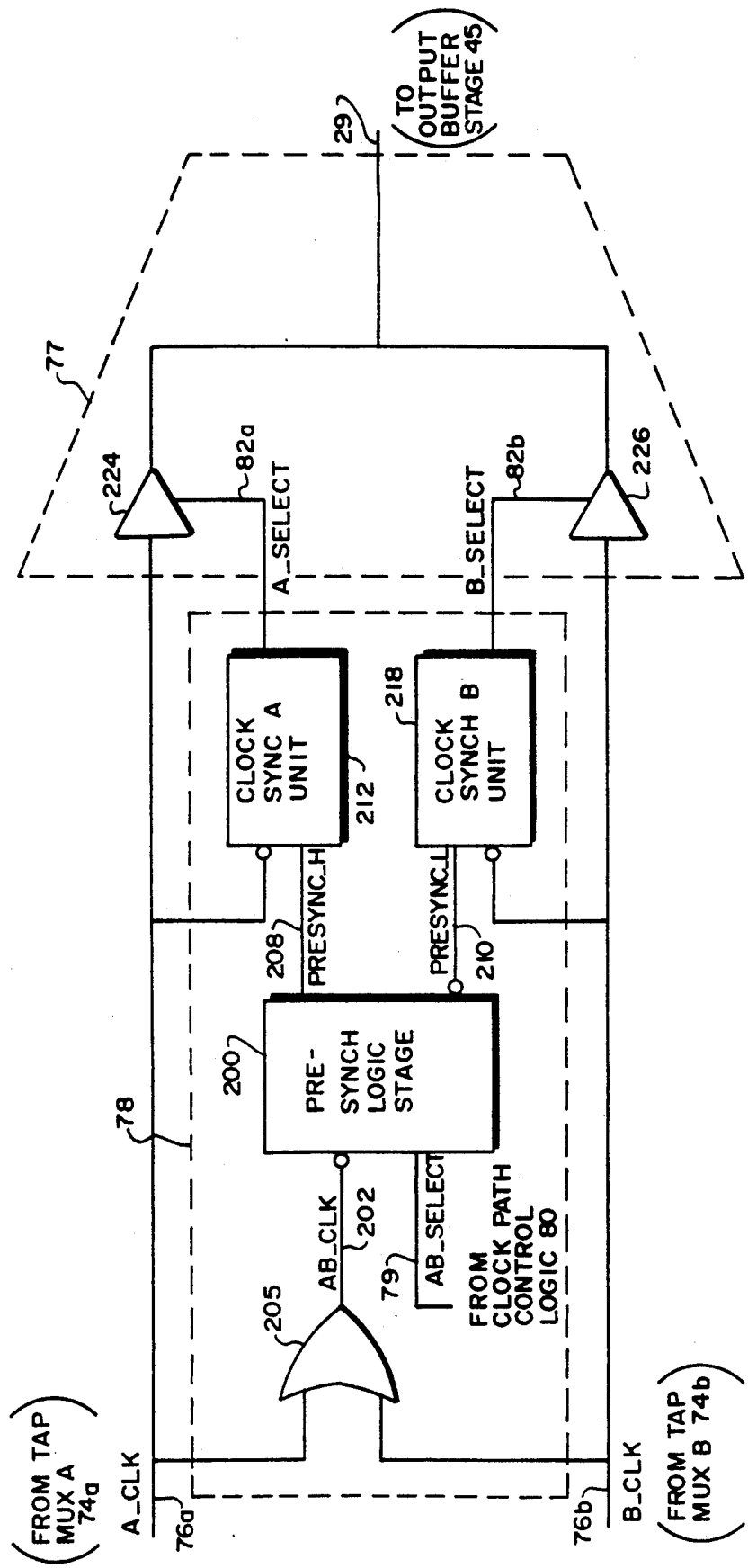
FIG. 7 is a block diagram of the update synchronizer and a clock delay multiplexer in accordance with the invention.

A block diagram of the PVTL clock delay path 60 of the delay regulator is depicted in FIG. 4. The clock delay path 60 is preferably one hundred and forty-four bits wide and generally includes a measurement circuit 62 and a pair, i.e., A and B, of delay adjusting units 64a, 64b, generally designated 64. A measurement signal propagates through the replica loop 50 and into a tapped measurement delay line 65 where an "absolute" measurement of the chip intrinsic propagation delay is performed. The tapped delay line 65 preferably comprises a string of inverters. To maintain correct polarity from the delay line, the taps are placed at the outputs of inverter-pairs. FIG. 7 illustrates an inverter-pair configuration 70 of the delay line 65. Specifically, the delay resolution of the system is +0, −one inverter pair; in other words, the resolution is an inverter pair 70, which is a unit of measurement granularity.

The results of the measurement are then loaded into a measurement latch 66 where they are decoded by an internal decoder circuit. In a preferred embodiment of the invention, the decoder circuit (not shown) employs a conventional Johnson counter-style decoder configuration. The decoded signals may thereafter be loaded into control registers 68a, 68b, generally designated 68, of the A and B delay adjusting units 64. In addition to the control registers, each delay unit 64 includes a clock delay line and a tap select multiplexer. The clock delay lines 72a, 72b, generally designated 72, receive a processed clock signal on line 28 from the input buffer stage 40. The use of two delay adjusting units 64, i.e., "double-buffering", allows the regulator to adjust the clock signal in one of the units by adding the desired delay, while the other unit still compensates for the previously-measured intrinic delay of chip. This technique contributes, in part, to a non-interrupted output clock signal.

The output of each delay control register 68 enables respective A and B tap select multiplexers 74a, 74b, generally designated 74, to select an appropriate tap from its associated clock delay line 72. As with the measurement delay line 65 described previously, the A and B delay lines 72 preferably comprise a string of inverters having taps at inverter-pair outputs. A selected tap inserts a desired amount of delay to the processed input clock signal.

Each tap multiplexer 74 has an input for every tap, generally designated 75, in the delay line 72 and one output. The multiplexer 74 is preferably implemented as an array of gates in a generally conventional "OR tree" configuration. The multiplexer 74 selects one of the one hundred and forty-four taps 75 from the clock delay line 72, which, in turn, inserts the proper amount of delay to the processed clock signal on line 28 driven into the clock delay lines. The resulting A and B clock signals, A_CLK on line 76a and B_CLK on line 76b, from the multiplexers 74 are thereafter coupled to a two-to-one clock delay multiplexer 77. Here, one of the clock signals is selected and forwarded via a delay-regulated clock path 29 to the output buffer stage 45 for distribution to circuitry 24 on the module.

Figure 5:
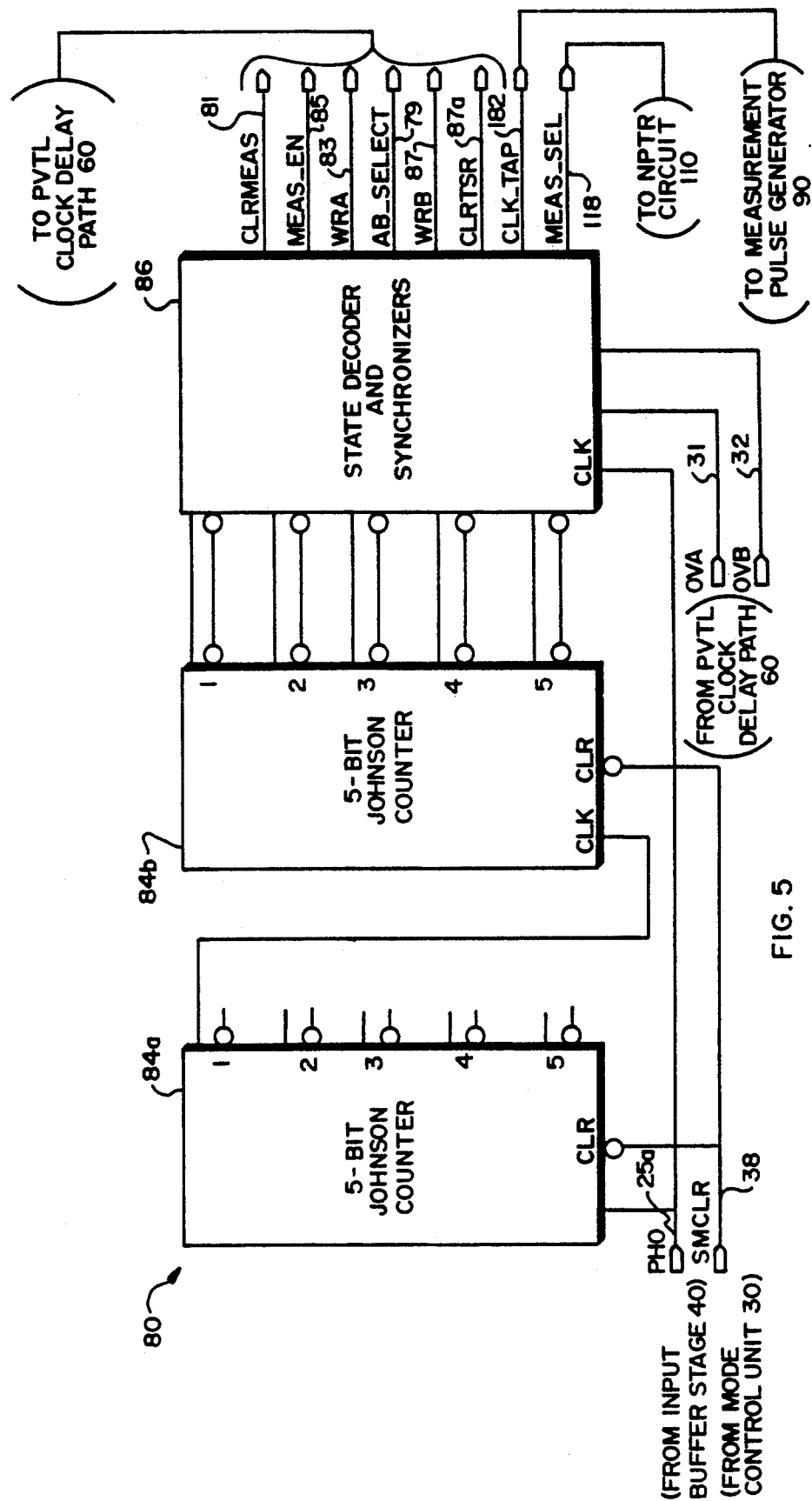
FIG. 5 is a block diagram of a clock path control logic unit of the delay regulator.

Selection, i.e., switching, between the input clock signals is based upon a control signal originating form the clock path control logic 80. FIG. 5 is a block diagram of the control logic unit 80, which preferably comprises registers and combinational logic configured to produce a sequential logic circuit, e.g., a "state machine". In an embodiment of the clock path control logic 80, the state machine comprises two cascaded, 5-bit Johnson counters 84a, 84b coupled to a decoder and synchronizer unit 86. The state machine, herein also referred to at 80, controls the sequencing of operations during a PVTL delay regulation cycle by generating timing signals asynchronous to the operation of the PVTL clock delay path 60. The timing signals are based on a non-delayed input clock signal; as a result, they typically have a phase different from that of the clock signals delayed by the regulator. One of the timing signals, e.g., AB_SELECT on line 79, specifies which of the two clock input signals are to be driven out of the clock delay multiplexer 77 (FIG. 4). Accordingly, the output signal on line 29 from the delay multiplexer 77 may be momentarily interrupted when switching between input signals on command from the AB_SELECT signal, as illustrated by the timing diagram of FIG. 6.

Figure 6:
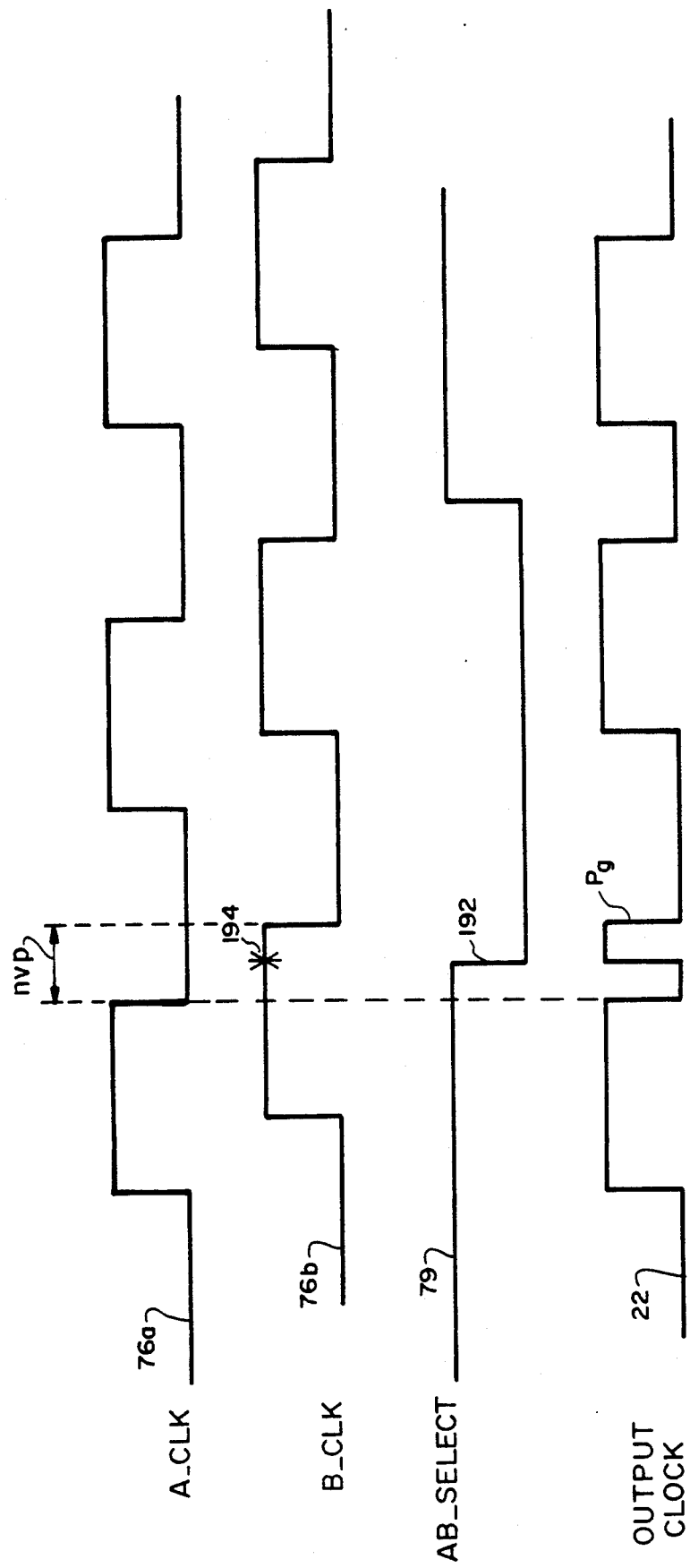
FIG. 6 is a diagram illustrating the relative timing of a clock signal that is distributed from the delay regulator without use of an update synchronizer in accordance with the invention.

FIG. 6 is a diagram illustrating the relative timing of an output clock signal on line 22 that is distributed from the repeater chip 20 without use of an update synchronizer in accordance with the invention. A_CLK on line 76a and B_CLK on line 76b are the clock signals from the tap multiplexers 74 of which one is always selected and driven to the output buffer stage 45 (FIG. 4) for distribution to circuitry 24 on the module. In general, when AB_SELECT on line 79 changes during a delay regulation cycle, the clock path control logic 80 is requesting a clock "skew" adjustment. In a preferred embodiment of the invention, if the AB_SELECT signal is "high", the A_CLK signal is selected by the multiplexer 77; if AB_SELECT is "low", then the B_CLK signal is selected for output distribution.

As can be seen, the A_CLK and B_CLK signals are mostly overlapping clock signals; the non-overlapping portions nvp represent the worst-case regulation accuracy of the absolute delay regulator, which typically is one unit of delay. When the AB_SELECT signal on line 79 is high, the A_CLK signal is selected and is the output clock signal on line 22 driven from the multiplexer 77. Later, the AB_SELECT signal "switches" low at 192 and the B_CLK signal is selected near the falling, i.e., trailing, edge of its digital pulse at 194. However, because of possible lap between the A_CLK and B_CLK signals, the output signal has a pulse with an extremely short duration, i.e., a "glitch" $p_g$. The occurance of such a glitch $p_g$ typically violates the set-up and hold times of receiver circuitry, which, in turn, disrupts the synchronous operation of the computer system; thus, it is clear that such a glitch should be avoided.

In accordance with the invention, clock synchronization logic 78 (FIG. 4) provides dynamic, i.e., "on-the-fly", switching between the input clock signals on lines 76a and 76b of the clock delay multiplexer 77 in a manner that does not compromise the integrity of the output signal on line 29. Specifically, the clock synchronization logic, i.e., the "update synchronizer" 78, ensures that both input clock signals are in a low state before the delay multiplexer 77 is enabled. It then retimes the AB_SELECT signal on line 79 to select an updated signal from the multiplexer inputs. This ensures that the output clock signal on line 22 from the repeater chip 20 does not "glitch" when the clock delay multiplexer 77 switches from one input signal to the other.

FIG. 7 is a block diagram of the update synchronizer 78 and the clock delay multiplexer 77. The clock update synchronizer 78 generally includes a two-stage synchronization unit for generating enable signals to select an output signal from among multiple input clock signals of the delay multiplexer 77. A pre-synchronization logic stage 200 receives at its inputs the AB_SELECT signal on line 79 and an AB_CLK signal on line 202, while delivering at its outputs a PRESYNCH_H signal on line 208 and a PRESYNCH_L signal on line 210. The AB_CLK signal is the output of an OR gate 205 having as inputs the A_CLK and B_CLK clock signals on lines 76a and 76b, respectively, driven from respective A and B tap multiplexers 74a, 74b (FIG. 4). The OR gate 205 conditions the clock signals for output switching by the multiplexer 77, as described further, the PRESYNCH_H signal is coupled to one input of an A clock synchronization unit 212; the other input to the unit is connected to A_CLK. Similarly, the PRESYNCH_L signal is coupled to one input of a B clock synchronization unit 218, while the B_CLK is fed to the other input.

Figure 8:
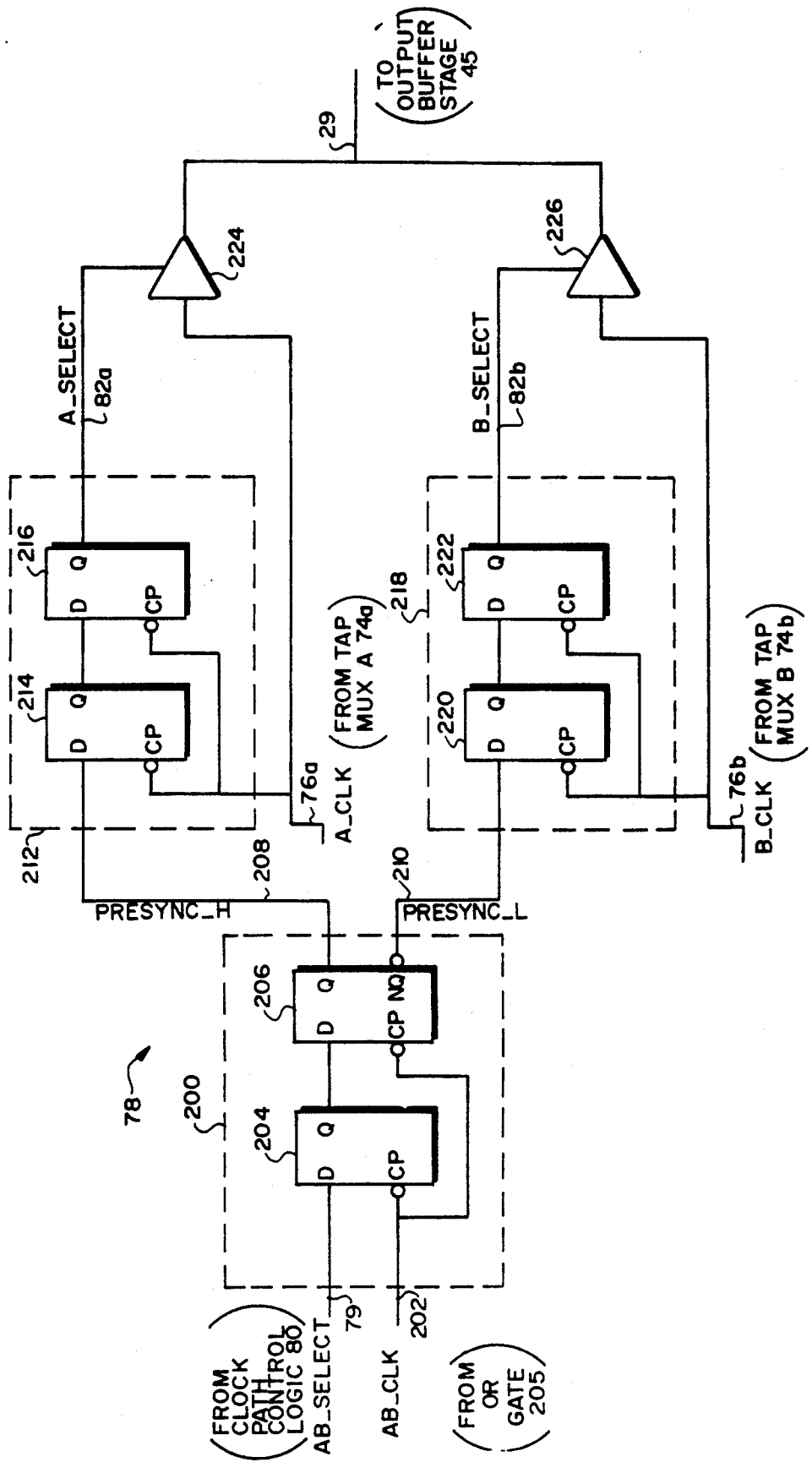
FIG. 8 is a circuit diagram of a two-stage synchronization unit of the update synchronizer.

FIG. 8 is a circuit diagram of the two-stage synchronization unit of the clock update synchronizer 78. In general, each synchronization circuit is configured as a "dual-rank" synchronizer, i.e., arranged in a back-to-back, flip-flop configuration. Preferably, the flip-flops are D-type "master-slave" units that are enabled by negative edges of input clock signals. Each master-slave flip-flop generally consists of a master latch that is "gated-on", i.e., activated, by a "high" state (assertion level) of the clock signal and a slave latch gated-on by a "low" state (non-assertion level) of the clock signal. The slave latch is connected to the output of the master latch.

Specifically, the AB_SELECT signal on line 79 is fed to the D-input of a first flip-flop 204 of the pre-synchronization logic unit 200; the Q-output of the flip-flop 204 is tied to the D-input of a second flip-flop 206. Both "ranks" of the pre-sychronization unit 200 are clocked by the AB_CLK signal on line 202. The Q-output of the flip-flop 206 of the pre-synchronization unit 200, i.e., PRESYNCH_H on line 208, is then fed to the D-input of a first flip-flop 214 of the A clock synchronization unit 212, while the Q-output of the flip-flop 214 is coupled to the D-input of a second flip-flop 216. The Q-output of the second flip-flop 216 is the selection enable signal A_SELECT on line 82a. The A clock synchronization unit 212 is clocked by the A_CLK signal on line 76a. Similarly, the NQ-output of the flip-flop 206 of the pre-synchronization unit 200, i.e., PRESYNCH_L on line 210, is fed to the D-input of a first flip-flop 220 of the B clock synchronization unit 218; the Q-output of the first flip-flop 220 is coupled to the D-input of a second flip-flop 222. The Q-output of the second flip-flop 222 is the selection enable signal B_SELECT on line 82b. Both "ranks" of the clock synchronization unit 218 are clocked by the B-CLK signal on line 76b.

Referring also to FIG. 7, the A_SELECT and B_SELECT signals are coupled to driver circuits 224 and 226, respectively, of the clock delay multiplexer 77. The driver circuits are preferably tri-state drivers arranged in a "wire OR" configuration to perform the multiplexer function. The state of the A_SELECT signal on line 82a and the B_SELECT signal on line 82b control the outputs of the drivers 224 and 226 as the clock delay multiplexer 77 switches between its respective input signals A_CLK on line 76a and B_CLK on line 76b. Specifically, output switching occurs on command from the AB_SELECT signal on line 79 and before a rising edge of the output signal on line 29.

Figure 9:
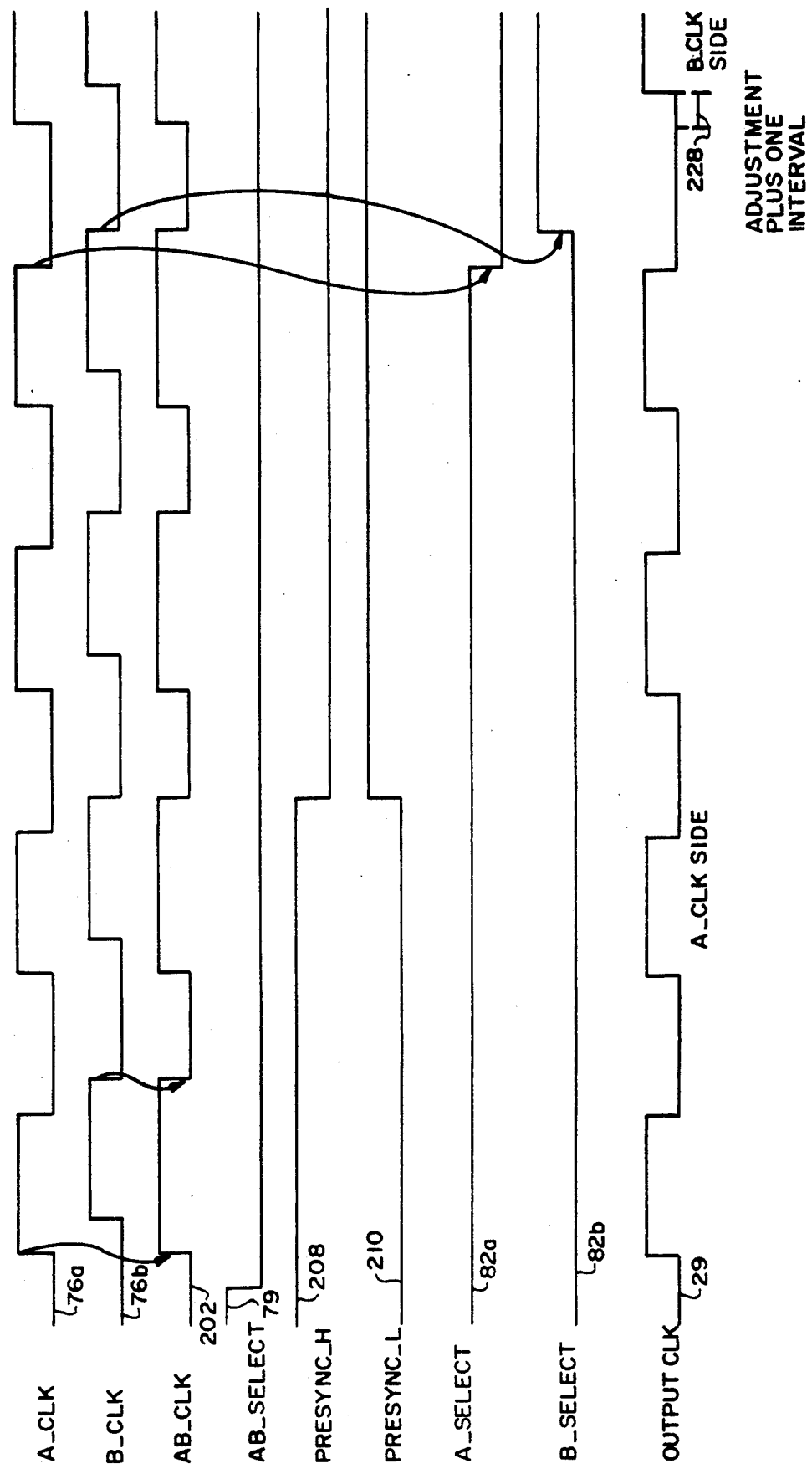
FIG. 9 is a timing diagram of an output signal of the clock delay multiplexer after synchronous switching between input clock signals.

The function of the update synchronizer 78 will now be described with reference to FIGS. 7-9. FIG. 9 is a timing diagram of the output of the clock delay multiplexer 77 after synchronous switching between the A_CLK and B_CLK input signals on lines 76a and 76b. The clock path control logic 80 (FIG. 5) asserts AB_SELECT on line 79 to select either the A or B clock path during a delay regulation cycle. The AB_SELECT signal is "pre-synchronized" to ensure that common synchronous control signals are applied to the A and B clock synchronization units 212 and 218. Two full clock cycles are needed to transform the AB_SELECT signal into the complementary synchronous control signals PRESYNCH_H and PRESYNCH_L on lines 208 and 210.

The mostly overlapping A_CLK and B_CLK input signals are "conditioned" by the OR gate 205 to form the AB_CLK signal on line 202, which is used to clock the pre-synchronization logic unit 200. Since the AB_CLK signal is high when the A_CLK signal or B_CLK signal is high, the output of the pre-synchronization logic 200 changes only after the falling edge of the latest of either signal. It should be noted that there is some propagation delay through the OR gate 205, which would slightly delay the AB_CLK signal as shown; in addition, there may be a maximum duty cycle distortion of one unit of delay, i.e., an inverter-pair, for this signal.

The PRESYNCH_H and PRESYNCH_L signals on lines 208 and 210 are then separately synchronized to the clock signals of each clock path. Specifically, the PRESYNCH_H and PRESYNCH_L signals are transformed into complementary A_SELECT and B_SELECT enable signals having phases within the domains of the input clock signals, A_CLK and B_CLK. Again, two full clock cycles are required to transform the PRESYNCH signals into A_SELECT and B_SELECT signals. This ensures that transitions of the selection enable signals occur during the same clock period, i.e., specifically, during the pulse width low part of the clock period.

Operationally, the A_SELECT and B_SELECT signals on lines 82a and 82b are asserted or deasserted after the fourth trailing edge of the A_CLK and B_CLK signals, respectively. The drivers 224 and 226 of the delay multiplexer 77 are likewise enabled or disabled during a quiescent period of time, i.e., when both clock signals are in the low state. Since the drivers are presenting similar values at their outputs, the clock delay multiplexer 77 delivers a "glitch-free" output signal on line 29. FIG. 9 specifically shows a positive B_CLK adjustment at 228 to the output clock waveform on line 29 of the delay multiplexer 77.

A feature of the present invention is that the update synchronizer can accomodate any number of clock signal phases. The AB_SELECT signal driven to the flip-flops of the synchronizer is common for all phases of clock signals processed by the delay regulator. The synchronizer will switch to the appropriate clock signal for each phase when it is "convenient". Although switching will occur at slightly different times for each phase, it will occur during an "innocuous" time, i.e., a time that is non-damaging to the computer system.

The foregoing description has been directed to a specific embodiment of this invention. It will be apparent, however, that variations and modifications may be made to the described embodiment, with the attainment of some or all of its advantages. Therefore, it is the object of the appended claims to cover all such variations and modifications as come within the true spirit and scope of the invention.

What is claimed is:

1. A synchronizer for generating complementary selection enable signals for enabling a multiplexer to select an output signal from among multiple input clock signals with differing phases, said input clock signals having mostly overlapping assertion levels, said synchronizer comprising:
   means for conditioning said input clock signals to generate a conditioned output signal having an assertion level equal to the combined assertion levels of said input clock signals;
   means for transforming an asynchronous control signal into complementary synchronous control signals in response to said conditioned signal, said asynchronous control signal having a phase different from that of said input clock signals; and
   means for transforming said complementary synchronous control signals into said complementary selection enable signals in response to said input clock signals, said complementary selection enable signals having phases within the domains of said input clock signals,
   whereby said complementary selection enable signals for enabling the multiplexer to select said output signal from among said input signals in a manner that avoids interruption of said output signal.

2. The synchronizer of claim 1 wherein said means for transforming said asynchronous control signal comprises a pre-synchronization unit having a first flip-flop with outputs coupled to a second flip-flop, said flip-flops arranged in a dual-rank configuration and wherein complementary outputs of said second flip-flop comprise said complementary synchronous control signals.

3. The synchronizer of claim 2 wherein said means for transforming said complementary synchronous control signals comprises a first clock synchronization unit for receiving as a data input a first of said complementary synchronous control signals and a second clock synchronization unit for receiving as a data input a second of said complementary synchronous control signals, each of said clock synchronization units comprising a plurality of flip-flops arranged in a dual-tank configuration.

4. The synchronizer of claim 3 wherein said first clock synchronization unit is clocked by a first of said multiple input clock signals and said second clock synchronization unit is clocked by a second of said multiple input clock signals to thereby ensure that transitions of said complementary selection enable signals occur during the same clock period.

5. The synchronizer of claim 3 wherein said means for conditioning comprises a logic OR gate and wherein each of said input clock signals has a rising edge and a falling edge, said conditioned output signal transitioning at the earlier of said rising edges and the later of said falling edges of said input clock signals.

6. A method for generating complementary selection enable signals for enabling a multiplexer to select an output signal from among multiple input clock signals with differing phases, said input clock signals having mostly overlapping assertion levels, said method comprising the steps of:
   conditioning said input clock signals to generate a conditioned output signal having an assertion level equal to the combined assertion levels of said input clock signals;
   transforming an asynchronous control signal into complementary synchronous control signals in response to said conditioned signal, said asynchronous control signal having a phase different from that of said input clock signals; and
   transforming said complementary synchronous control signals into said complementary selection enable signals in response to said input clock signals, said complementary selection enable signals having phases within the domains of said input clock signals,
   whereby said complementary selection enable signals for enabling the multiplexer to select said output signal from among said input signals in a manner that avoids interruption of said output signal.

* * * * *